United States Patent [19]

Ishii

[11] Patent Number: 5,744,862
[45] Date of Patent: Apr. 28, 1998

[54] REDUCED THICKNESS SEMICONDUCTOR DEVICE WITH IC PACKAGES MOUNTED IN OPENINGS ON SUBSTRATE

[75] Inventor: Hideki Ishii, Tokyo, Japan

[73] Assignee: Mitsubishi Denki Kabushiki Kaisha, Tokyo, Japan

[21] Appl. No.: 753,094

[22] Filed: Nov. 20, 1996

[30] Foreign Application Priority Data

Mar. 29, 1996 [JP] Japan ............................ 8-076947

[51] Int. Cl.⁶ .................... H01L 23/36; H01L 25/04; H01L 23/02; H01L 23/12
[52] U.S. Cl. .................. 257/693; 257/680; 257/686; 257/723; 257/731; 257/737; 257/777; 257/774
[58] Field of Search ..................... 257/693, 680, 257/686, 723, 730, 731, 733, 737, 778, 777, 774, 773

[56] References Cited

U.S. PATENT DOCUMENTS

| | | | |
|---|---|---|---|
| 5,045,921 | 9/1991 | Lin et al. | 257/680 |
| 5,191,404 | 3/1993 | Wu et al. | 257/723 |
| 5,239,198 | 8/1993 | Lin et al. | 257/693 |
| 5,299,094 | 3/1994 | Nishino et al. | 257/686 |
| 5,521,992 | 5/1996 | Chun et al. | 257/680 |
| 5,530,292 | 6/1996 | Waki et al. | 257/777 |
| 5,545,922 | 8/1996 | Golwalkar et al. | 257/686 |
| 5,563,773 | 10/1996 | Katsumata | 257/723 |

FOREIGN PATENT DOCUMENTS

| | | | |
|---|---|---|---|
| 2630859 | 11/1989 | France | 257/723 |
| 6290959 | 4/1987 | Japan . | |
| 6373694 | 4/1988 | Japan . | |
| 0191460 | 8/1989 | Japan | 257/723 |
| 6275739 | 9/1994 | Japan . | |
| 0007777 | 5/1991 | WIPO | 257/723 |

OTHER PUBLICATIONS

I.B.M Technical Disclosure Bulletin vol. 34, No. 8 Jan. 1992 pp. 97 and 98.

*Primary Examiner*—Tom Thomas
*Assistant Examiner*—Alexander Oscar Williams
*Attorney, Agent, or Firm*—Leydig, Voit & Mayer, Ltd.

[57] ABSTRACT

A semiconductor device of the present invention enables mounting with a reduced thickness and a high density. IC packages (17) are mounted in each opening (12) on both surfaces of a substrate (11) in such a way that package bodies (18) are half accommodated in the opening (12) formed in the substrate (11).

10 Claims, 8 Drawing Sheets

REDUCED THICKNESS SEMICONDUCTOR DEVICE WITH IC PACKAGES MOUNTED IN OPENINGS ON SUBSTRATE

BACKGROUND OF THE INVENTION

1. Field of the Invention

The present invention relates to a semiconductor device enabling mounting, with a small thickness and a high density.

2. Description of the Background Art

FIG. 6 is a side view showing a conventional semiconductor device. As shown in FIG. 6, the conventional semiconductor device includes a plurality of semiconductor integrated circuit packages (hereinafter referred to as IC packages) 2 directly mounted on upper and lower surfaces of a mother board 1. The numeral 3 denotes lands disposed on the upper and lower surfaces of the mother board I for mounting the IC packages 2.

With the aforementioned conventional semiconductor device having the IC packages 2 directly mounted on the upper and lower surfaces of the mother board 1, areas of the upper and lower surfaces of the mother board 1 limit the mounting space to cause difficulty in implementing high density mounting. Furthermore, the IC packages 2 mounted in a floating manner cause the thickness of mounting to be large for its low mounting density.

SUMMARY OF THE INVENTION

According to a first aspect of the present invention, a semiconductor device comprises: a substrate having an opening; and integrated circuit packages each having a package body in facing relation to the opening, and leads protruding from the package body and supported on the substrate on the periphery of the opening, the integrated circuit packages being disposed on the upper surface side and the lower surface side of the substrate with respect to the opening, at least one of the integrated circuit packages on the upper and lower surface sides being half accommodated in the opening.

Preferably, according to a second aspect of the present invention, in the semiconductor device, the leads are straight leads.

Preferably, according to a third aspect of the present invention, the semiconductor device further comprises: external connection terminals disposed on the upper surface side and the lower surface side of the substrate with corresponding ones of the upper side and lower side external connection terminals electrically connected to each other, and electrically connected to the leads on the same surface side, and solder bumps provided on the external connection terminals on one surface side of the substrate.

Preferably, according to a fourth aspect of the present invention, in the semiconductor device, a plurality of aforementioned semiconductor devices are stacked on one surface of a mother board and connected and fixed with the solder bumps.

Preferably, according to a fifth aspect of the present invention, in the semiconductor device, a plurality) of aforementioned semiconductor devices are stacked also on the other surface of the mother board and connected and fixed with the solder bumps.

Preferably, according to a sixth aspect of the present invention, in the semiconductor device, the external connection terminals include a dummy terminal to outnumber the leads.

Preferably, according to a seventh aspect of the present invention, in the semiconductor device, the dummy terminal includes a plurality of dummy terminals aligned in at least one linear array different from a linear array in which the external connection terminals other than the dummy terminals are aligned.

Preferably, according to an eighth aspect of the present invention, in the semiconductor device, the linear array of dummy terminals and the linear array of external connection terminals other than the dummy terminals are formed in a staggered configuration.

Preferably, according to a ninth aspect of the present invention, in the semiconductor device, the substrate is shaped such that a part of the substrate which is located on one side or a pair of opposed sides of the opening is removed so as not to surround the opening.

A tenth aspect of the present invention is directed to a method of manufacturing a semiconductor device comprising a substrate having an opening, integrated circuit packages each having a package body half accommodated in the opening and leads protruding from the package body and supported on the substrate on the periphery of the opening, the integrated circuit packages being disposed in the opening on the upper surface side and the lower surface side of the substrate the leads being straight leads, external connection terminals disposed on the upper surface side and the lower surface side of the substrate with corresponding upper and lower ones of the external connection terminals electrically connected to each other, and electrically connected to the leads on the same surface side, and solder bumps provided on the external connection terminals on one surface side of the substrate. According to the present invention, the method of manufacturing the semiconductor device comprises: a first step of stacking a plurality of aforementioned semiconductor devices on one surface of a mother board, wherein eutectic or high-temperature solder bumps are used as the solder bumps and a flux or a solder paste is supplied to abutments between the solder bumps and other portions, a second step of melting the solder bumps to connect and fix the plurality, of semiconductor devices stacked in the first step on the one surface of the mother board, a third step of turning over the mother board and stacking a plurality of aforementioned semiconductor devices on the other surface of the mother board, wherein low-temperature solder bumps are used as the solder bumps and a flux or a solder paste is supplied to abutments between the solder bumps and other portions, and a fourth step of melting the solder humps to connect and fix the plurality of semiconductor devices stacked in the third step on the other surface of the mother board.

According to the semiconductor device of the first aspect of the present invention, since integrated circuit packages are mounted on both sides of a substrate, with at least one of the integrated circuit packages on the upper and lower surface sides half accommodated in an opening of the substrate, it is possible to reduce the thickness of mounting without decreasing the heat radiation property.

According to the semiconductor device of the second aspect of the present invention, the leads are straight leads. This produces the effect of allowing the packages to be easily half-accommodated into the substrate opening, i.e., of allowing mounting with a reduced thickness with facilitated lead processing.

According to the semiconductor device of the third aspect of the present invention, solder bumps on the external connection terminals on one surface of the substrate easily allow the packages to be stacked into multiple stages to increase the mounting density.

According to the semiconductor device of the fourth aspect of the present invention, substrates each provided with integrated circuit packages on its both sides are mounted into a multi-stage on a mother board, which reduces the mounting area and realizes high-density mounting. Furthermore, since each of the substrates provided with integrated circuit packages on both surfaces has at reduced thickness, they can be stacked into multiple stages with a small thickness.

According to the semiconductor device of the fifth aspect of the present invention, since the substrates each provided with integrated circuit packages on both sides are mounted into multiple stages on both sides of the mother board, the mounting can be realized with a still higher density as compared with the one-sided multi-stage mounting.

According to the semiconductor device of the sixth aspect of the present invention, when integrated circuit packages to be mounted into a plurality of stages in the vertical direction have nonsharable leads, the integrated circuit packages can be easily mounted into a multi-stage by connecting one of the nonsharable leads to a dummy lead.

According to the seventh aspect of the present invention, the semiconductor device sufficiently meets the requirement for the provision of the multiplicity of nonsharable leads.

According to the semiconductor device of the eighth aspect of the present invention, the staggered configuration permits the interconnections to be of linear form, facilitating wiring operation.

According to the semiconductor device of the ninth aspect of the present invention, the area of the substrate may be reduced by the amount of the removed part of the substrate. This requires a smaller mounting( space on the mother board to enhance the mounting efficiency.

According to the method of manufacturing the semiconductor device of the tenth aspect of the present invention, in the case where substrates with integrated circuit packages mounted on both sides are mounted into multiple stages on both sides of a mother board, the substrates, even if they are heavy, can be prevented from dropping off the back of the mother board in the course of production, vehicle ensures double-sided mounting.

The present invention has been made to solve the problems described before and it is an object of the present invention to provide a semiconductor device enabling mounting with a reduced thickness and a high density.

These and other objects, features, aspects and advantages of the present invention will become more apparent from the following detailed description of the present invention when taken in conjunction with the accompanying drawings.

DESCRIPTION OF THE PREFERRED EMBODIMENTS (First Preferred Embodiment)

Figure 1:
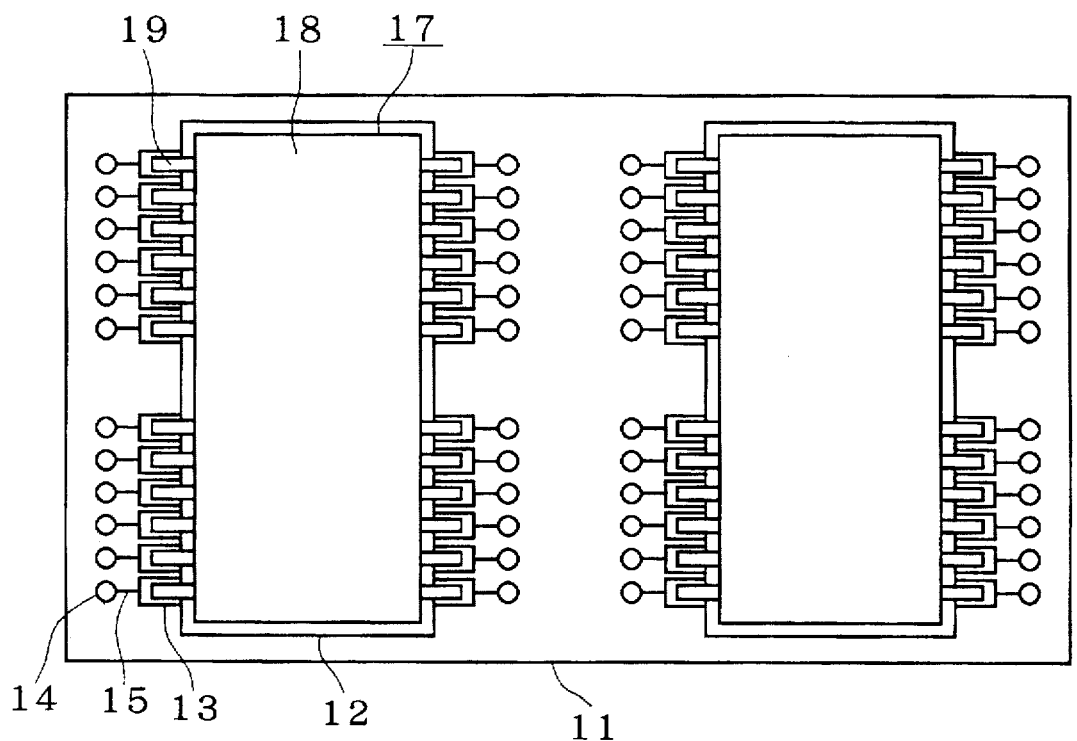
FIG. 1 is a plan showing a semiconductor device according to a first preferred embodiment of the present invention.
Figure 2:
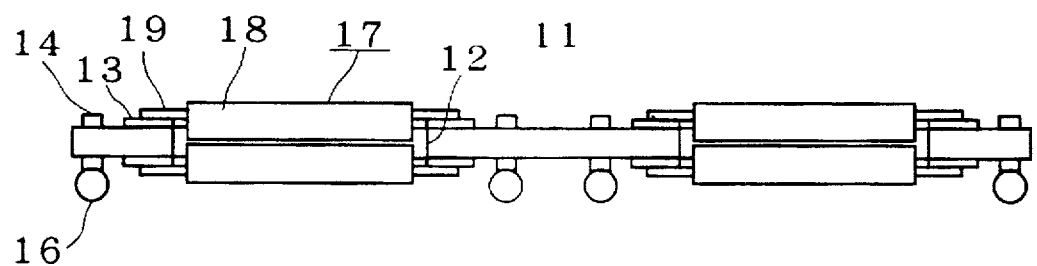
FIG. 2 is a side view of FIG. 1.

FIG. 1 is a plane showing a semiconductor device according to a first preferred embodiment of the present invention and FIG. 2 is side view. This semiconductor device has a substrate 11. The substrate 1 has two openings 12 communicating with its upper and lower surfaces. On the periphery of each opening 12, lands 13 for mounting IC packages are disposed on the upper and lower surfaces of the substrate 11. On the outer sides of the lands 13 on the upper and lower surfaces of the substrate 11, lands 14 for external connection are provided as external connection terminals in correspondence with the IC package mounting lands 13. Corresponding ones of the external connection lands 14 and the IC package mounting lands 13 are electrically connected through interconnections 15 disposed on the substrate 11. Also, vertically corresponding ones of the external connection lands 14 on the upper and lower sides of the substrate 11 are electrically connected through conductors provided in through holes for example. On one of the surfaces of the substrate 11 (on the lower side in FIG. 2), solder bumps 16 for external connection are provided on the external connection lands 14.

The IC package 17 has a package body 18 and straight leads 19 protruding straight in the lateral direction from the right and left sides of the body 18. The package body 18 is half accommodated in the opening 12 of the substrate 11 so that about half of the package body 18 is accommodated in the opening 12 and the other half thereof is exposed outward. The straight leads 19 are fixed and electrically connected on corresponding IC package mounting lands 13 such that they are supported by the substrate 11 on the periphery of the opening 12. Such IC packages 17 are provided on both sides, the upper and lower sides, of the substrate 11 for each opening 12.

The procedure of this installation is as follows. First, IC packages 17 are positioned on the upper surface of the substrate 11 and then the straight leads 19 are soldered to the IC package mounting lands 13 by the technique of reflow. Next, the substrate 11 is turned over and then IC packages 17 are similarly soldered also on the lower surface of the substrate 11.

According to this first preferred embodiment, mounting the IC packages 17 on both sides of the substrate 11 with the IC packages 17 half accommodated in the openings 12 of the substrate 11 allows a reduction in thickness. Furthermore, since about half of the package body 18 is exposed to the outside, the heat radiation property is not deteriorated almost at all even if its other half is accommodated in the opening 12. Moreover, the use of the straight leads 18 simplifies the lead processing. In addition, the solder bumps 16 provided on the external connection lands 14 on one surface of the substrate 11 easily allow the packages to be stacked into multiple layers as will be described in the following preferred embodiments to increase its mounting density.

(Second Preferred Embodiment)

Figure 3:
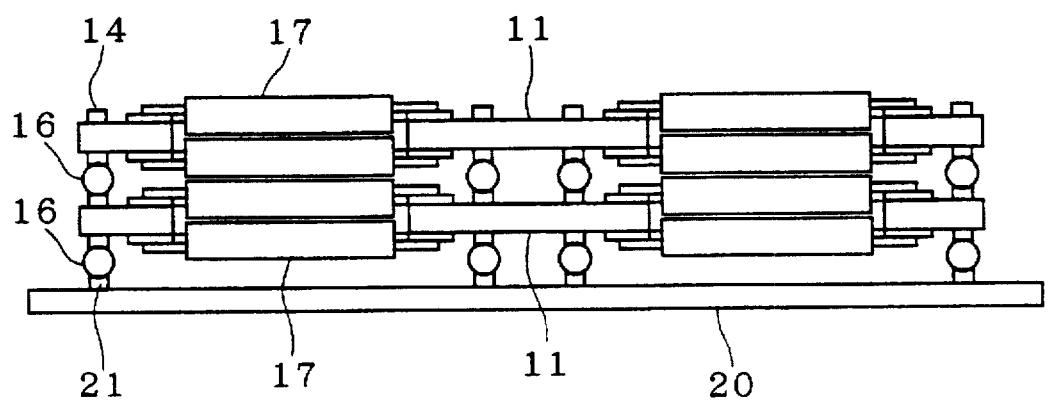
FIG. 3 is a side view of a semiconductor device according to a second preferred embodiment of the present invention.

FIG. 3 is a side view of a semiconductor device according to a second preferred embodiment of the present invention. This semiconductor device has a mother board 20. Lands 21 for mounting an IC package mounting substrate are disposed on the upper surface of the mother board 20. A substrate 11 having the IC packages 17 mounted on its both sides, as described in the first preferred embodiment, is fixed and electrically connected on the lands 21 through the solder bumps 16. On the external connection lands 14 on the upper surface of the first stack stage of substrate 11, a substrate 11 having the IC packages 17 mounted on both sides, as described in the first preferred embodiment, is further fixed and electrically connected through the solder bumps 16. This way, a plurality of substrates 11 each having the IC packages 17 on both sides, as shown in the first preferred embodiment, are stacked into a plurality of stages on one of the surfaces of the mother board 20 and connected and fixed through the solder bumps 16.

The procedure of connecting and fixing is as follows. First, substrates 11 having the IC packages 17 on both sides shown in the first preferred embodiment are positioned into a multi-stage on the upper surface of the mother board 20. At this time, a flux or a solder paste is supplied to abutments between the solder bumps 16 and the lands 14, 21. Next, the solder bumps 16 are melted to connect and fix the multi-stages of substrates 11 and the mother board 20.

According to this second preferred embodiment, mounting the substrates 11 each having the IC packages 17 on both sides into a multi-stage on the mother board 20 allows a reduction in mounting area and realizes a high density in mounting. Furthermore, since the substrates 11 having the IC packages 17 mounted on both sides have a reduced thickness, mounting them into a plurality of stack stages does not require a large thickness.

(Third Preferred Embodiment)

Figure 4:
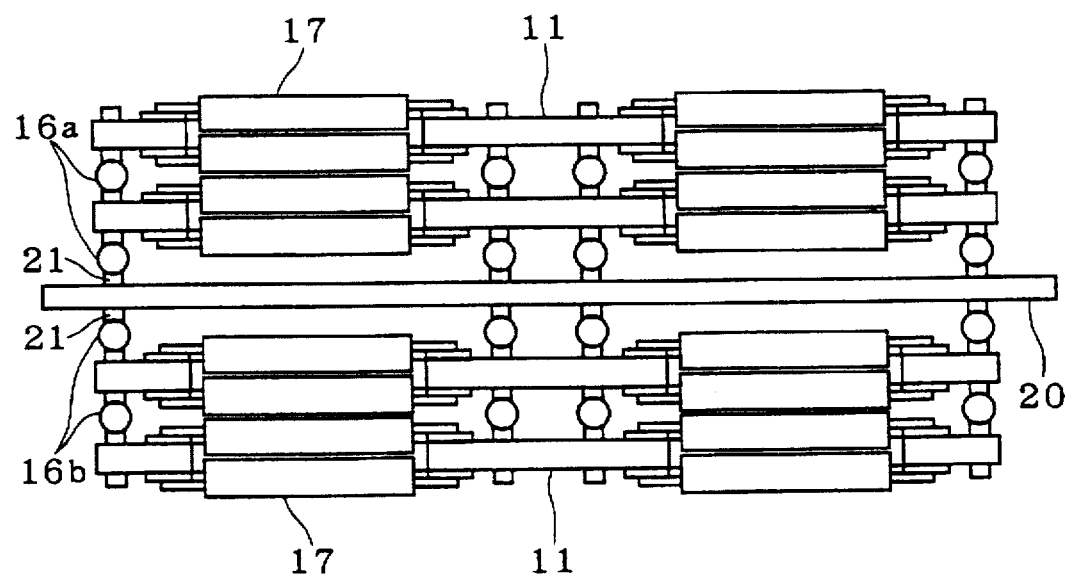
FIG. 4 is a side view of a semiconductor device according to a third preferred embodiment of the present invention.

FIG. 4 is a side view of a semiconductor device according to a third preferred embodiment of the present invention. The mother board 20 of this semiconductor device has lands 21 for mounting an IC package mounting substrate on both of its upper and lower surfaces. While the second embodiment has shown the structure in which the substrates 11 having the IC packages 17 mounted on both sides as shown in the first preferred embodiment are stacked into multiple stages and connected and fixed on only one of the surfaces of the mother board 20, this third preferred embodiment shows the structure in which the substrates 11 having the IC packages 17 mounted on both sides as shown in the first preferred embodiment are stacked into multiple stages and connected and fixed also on the other surface of the mother board 20.

The connecting and fixing is accomplished in the following procedure. First, according to the procedure explained in the second preferred embodiment, the substrates 11 having the IC packages 17 mounted on their respective both sides shown in the first preferred embodiment are connected and fixed into a multi-stage on one surface of the mother board 20. At this time, eutectic solder or high-temperature solder bumps are used as the solder bumps 16a. Next, the mother board 20 is turned over. Then, according to the procedure explained in the second preferred embodiment, the substrates 11 having the IC packages 17 mounted on their respective both sides shown in the first preferred embodiment are connected and fixed into multiple stages on the other surface of the mother board 20, too. At this time, low-temperature solder bumps are used as the solder bumps 16b. This prevents the solder bumps 16a melted and fixed in advance from melting again when the solder bumps 16b are melted, preventing the multi-stages of substrates 11 from falling off the back of the mother board 20 even if they are heavy, ensuring double-sided multi-stage mounting.

According to the third preferred embodiment, mounting the substrates 11 having the IC packages 17 mounted on both sides into a multi-stage on both sides of the mother board 20 realizes a still higher density in mounting than the second preferred embodiment.

(Fourth Preferred Embodiment)

Figure 5A:
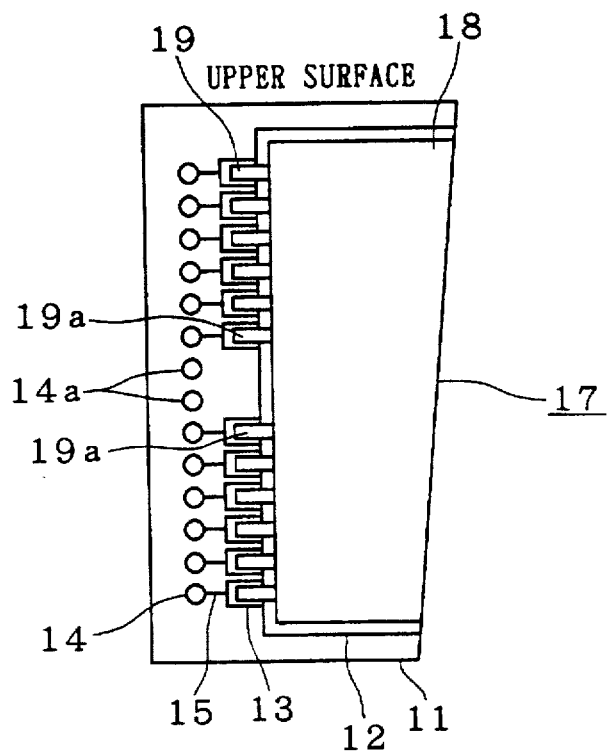
FIG. 5a is a fragmentary plane view showing the upper surface of a semiconductor device according to a fourth preferred embodiment of the present invention.
Figure 5B:
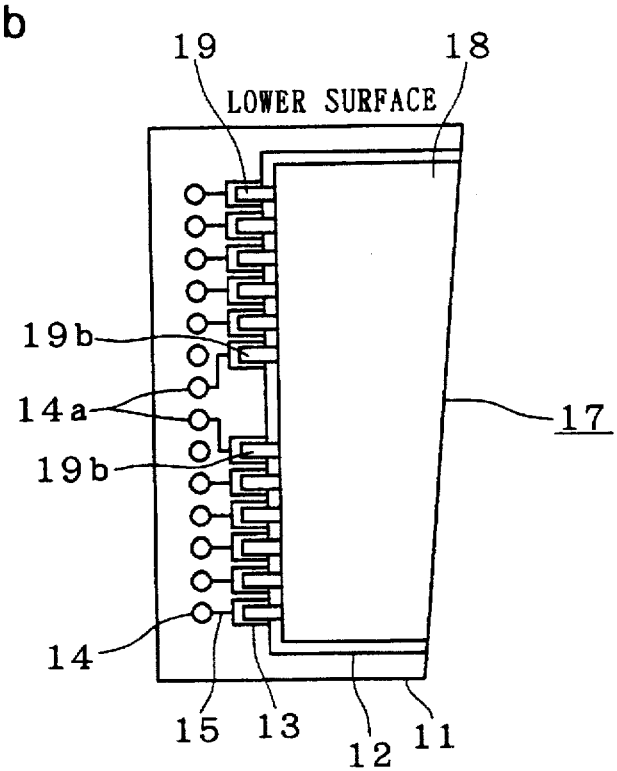
FIG. 5b is a fragmentary plane view showing the lower surface of a semiconductor device according to a fourth preferred embodiment of the present invention.
Figure 6:
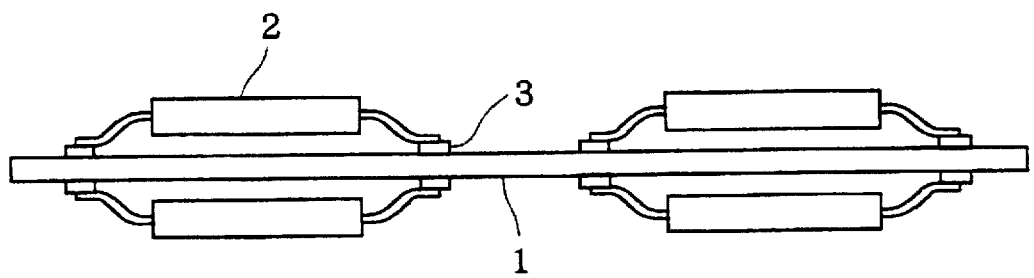
FIG. 6 is a side view showing a conventional semiconductor device.

FIGS. 5a and 5b are fragmentary plane showing at semiconductor device according to a fourth preferred embodiment of the present invention. This fourth preferred embodiment is effective when IC packages 17 electrically connected in a plurality of stages can not share some leads. In FIGS. 5a and 5b, in the IC packages 17 mounted on the upper and lower surfaces of the substrate 11, the lead 19a of the IC package 17 on the upper surface side and the lead 19b of the IC package 17 on the lower surface side can not be shared.

According to the fourth preferred embodiment, for the purpose of separately wiring the nonsharable leads 19, the substrate 11 has extra external connection lands, i.e., dummy lands 14a, disposed on its upper and lower sides to outnumber leads 19. Corresponding ones of the upper and lower dummy lands 14a are also electrically connected to each other, like the ordinary external connection lands 14. In the example in FIGS. 5a and 5b, the lead 19a of the upper side IC package 17 is electrically connected to the ordinary external connection land 14 through the interconnection 15 and the lead 19b of the lower side IC package 17 is electrically connected to the dummy land 14a through the interconnection 15.

According to the fourth preferred embodiment, it is possible to mount the IC packages into multiple stages as shown in FIG. 3 or FIG. 4 even if there exist nonsharable leads.

(Fifth Preferred Embodiment)

Figure 7:
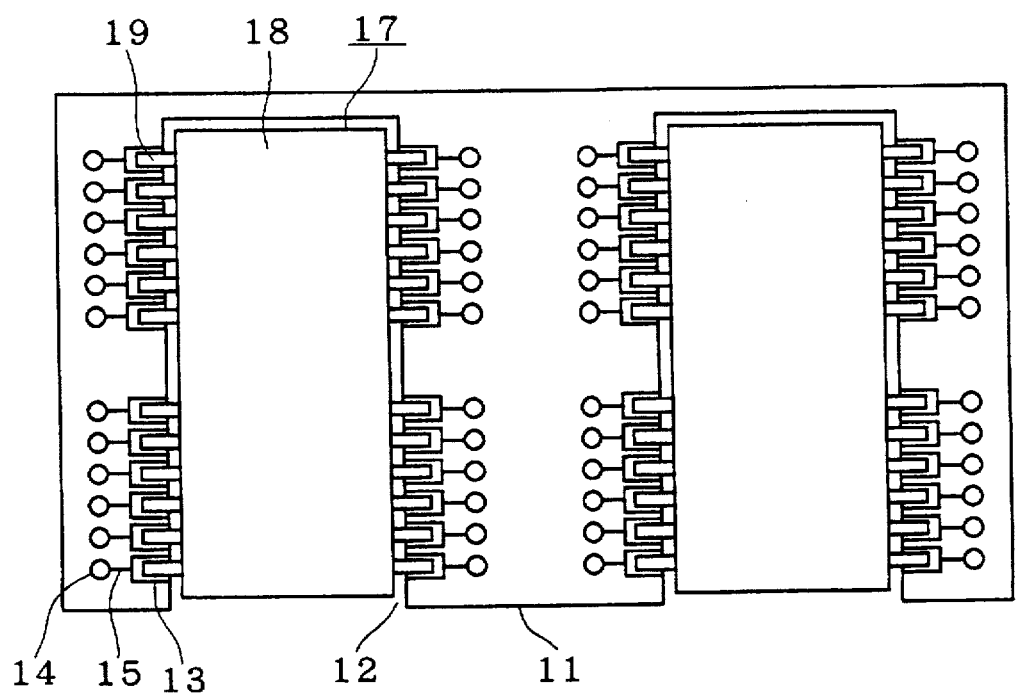
FIG. 7 is a plan view of a semiconductor device according to a fifth preferred embodiment of the present invention.
Figure 8:
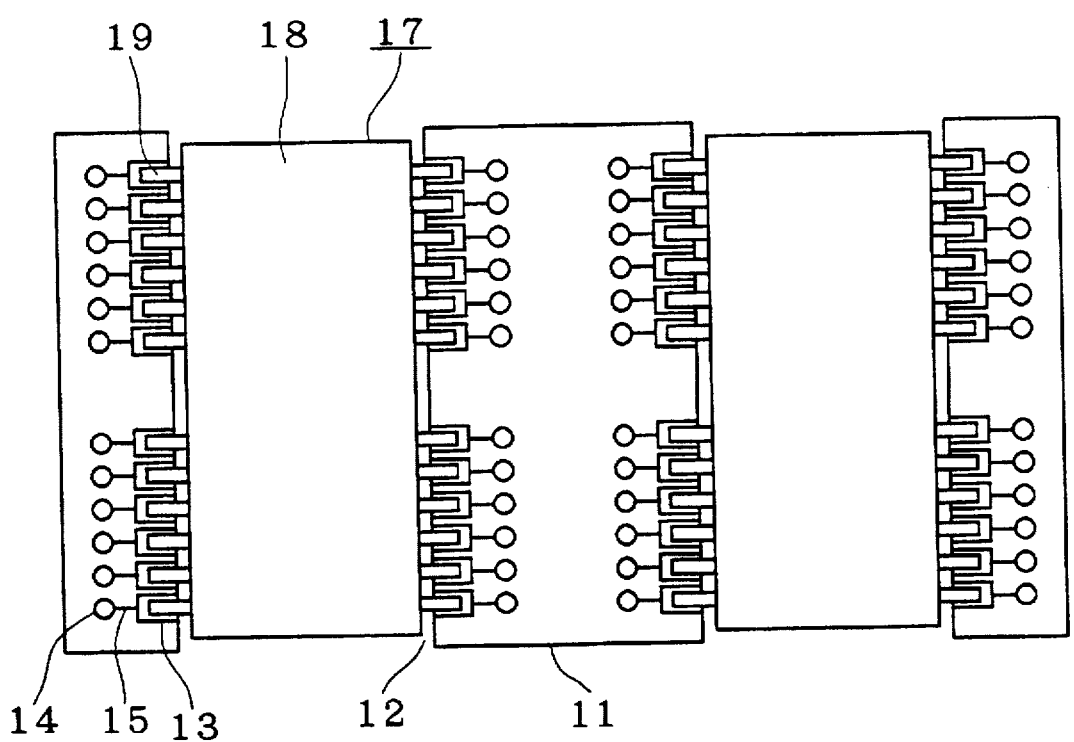
FIG. 8 is a plan view of a semiconductor device according to the fifth preferred embodiment of the present invention.

FIGS. 7 and 8 are plane views of semiconductor devices according to a fifth preferred embodiment of the present invention. The semiconductor device shown in FIG. 7, unlike the semiconductor device of the first preferred embodiment shown in FIG. 1, comprises the substrate 11 shaped such that a part of the substrate 11 which is located on one side (lower side in FIG. 7) of each of the openings 12 is removed so as not to surround the openings 12. The semiconductor device shown in FIG. 8, unlike the semiconductor device of the first preferred embodiment shown in FIG. 1, comprises the substrate 11 shaped such that parts of the substrate 11 which are located on a pair of opposed sides (upper and lower sides in FIG. 8) of each of the openings 12 are removed so as not to surround the openings 12. Other constructions of the semiconductor devices of FIGS. 7 and 8 are similar to those of the semiconductor device shown in FIGS. 1 and 2. Thus, the semiconductor devices of FIGS. 7 and 8 may be of the multi-stage mounting configuration illustrated in FIGS. 3 and 4.

According to the fifth preferred embodiment, the partial removal of the substrate 11 accordingly reduces the area of the substrate 11. This requires a small mounting space on the mother board, enhancing the mounting efficiency.

(Sixth Preferred Embodiment)

Figure 9A:
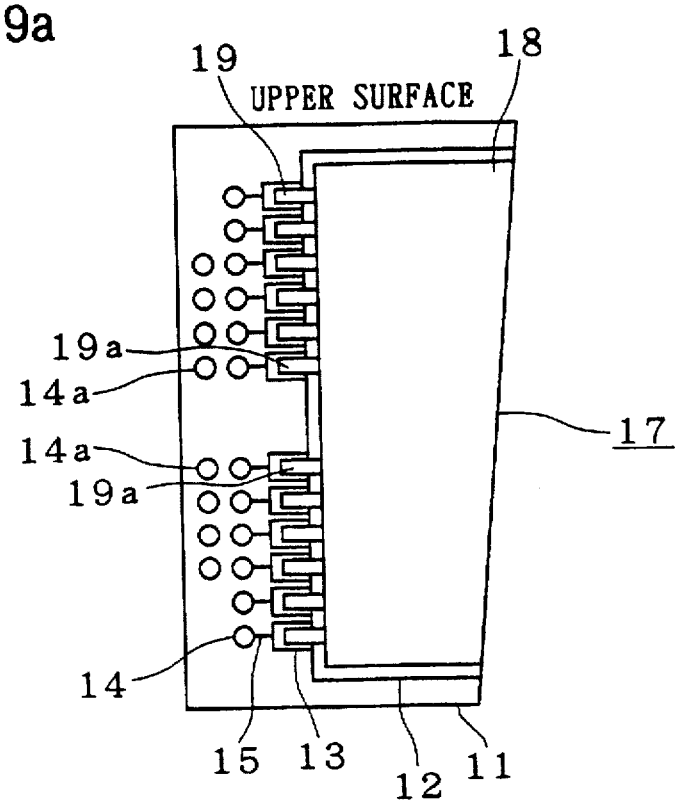
FIG. 9a is a fragmentary plan view of the upper surface of a semiconductor device according to a sixth preferred embodiment of the present invention.
Figure 9B:
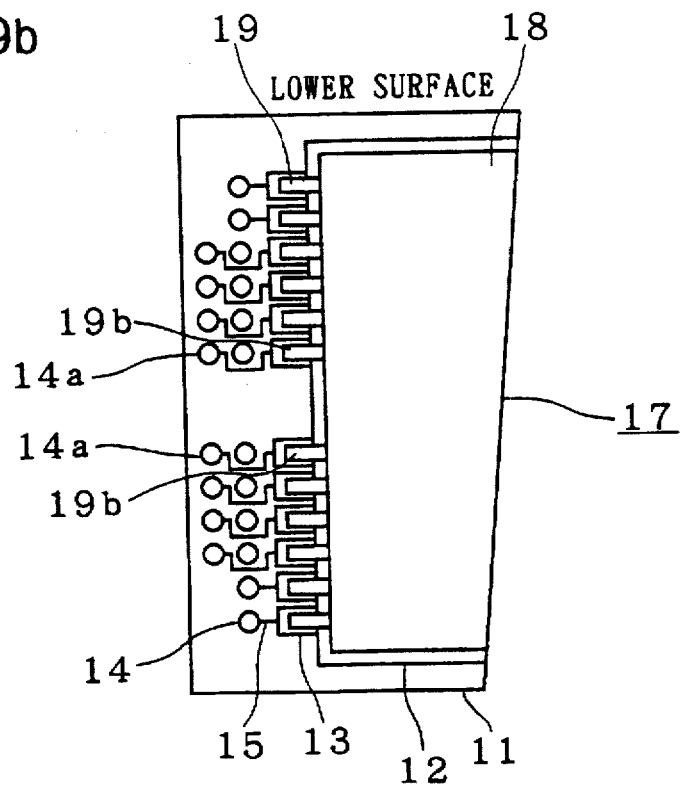
FIG. 9b is a fragmentary plane view of the lower surface of a semiconductor device according to a sixth preferred embodiment of the present invention.
Figure 10A:
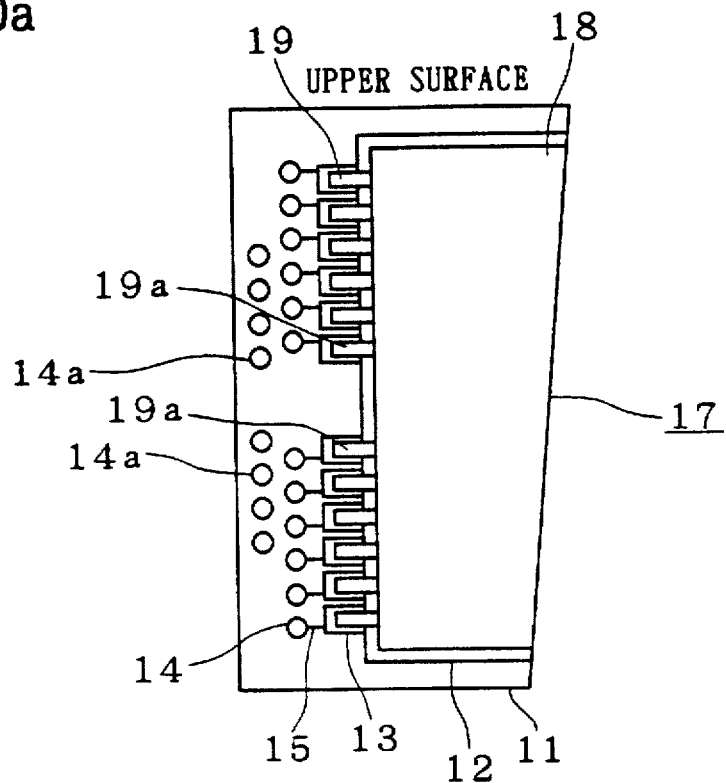
FIG. 10a is a fragmentary plan view of the upper surface of a semiconductor device according to the sixth preferred embodiment of the present invention.
Figure 10B:
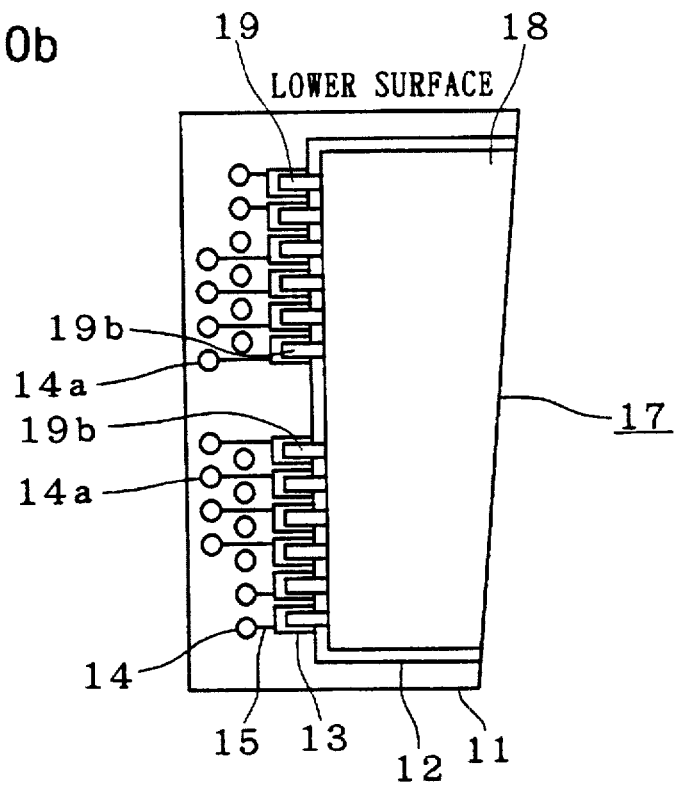
FIG. 10b is a fragmentary plane view of the lower surface of a semiconductor device according to the sixth preferred embodiment of the present invention.

FIGS. 9a and 9b and FIGS. 10a and 10b are fragmentary plane views of semiconductor devices according to a sixth preferred embodiment of the present invention. The semiconductor devices of FIGS. 9a and 9b and FIGS. 10a and 10b comprise dummy lands 14a similar to those of the fourth preferred embodiment shown in FIGS. 5a and 5b. In the semiconductor device of FIGS. 5a and 5b, the dummy lands 14a are aligned with the ordinary external connection lands 14 in at line. On the other hand, the dummy lands 14a in the semiconductor devices of FIGS. 9a and 9b and FIGS. 10a and 10b are aligned outside the linear array of ordinary external connection lands 14. Referring to FIGS. 9a and 9b, the dummy lands 14a are positioned just beside the ordinary external connection lands 14. Referring to FIGS. 10a and 10b, the linear array of dummy lands 14a and the linear array of ordinary external connection lands 14 are formed in a staggered configuration. Other constructions of the semiconductor devices of FIGS. 9a and 9b and FIGS. 10a and 10b are similar to those of the semiconductor device shown in FIGS. 5a and 5b.

The sixth preferred embodiment provides advantages to be described below in addition to the above described advantage of the fourth preferred embodiment. Specifically, if there are a multiplicity of leads nonsharable between the upper and lower surface sides, the arrangement of the single linear array of lands shown in FIGS. 5a and 5b limits the number of dummy lands 14a to a small number, failing to meet the requirement. In such a case, the provision of the linear array of dummy lands 14a aside from the linear array of ordinary external connection lands 14, that is, the arrangement of two linear arrays of lands as shown in FIGS. 9a and 9b and FIGS. 10a and 10b permits a greater number of dummy lands 14a to be provided, sufficiently meeting the requirement. To further increase the number of dummy lands 14a to he provided, the number of linear arrays of dummy lands 14a should be increased, that is, the dummy lands 14a should be arranged in three or more lines. Additionally, the staggered configuration of the lands as shown in FIGS. 10a and 10b allows the interconnections 15 to be of linear form, facilitating wiring operation.

(Modifications)

The shape of the leads 19 is not limited to the straight lead. It is merely necessary that the leads are shaped so that the package body 18 is half accommodated in the opening 12 of the substrate 11 when the leads 19 are supported on the substrate 11. This realizes a reduction in thickness with no sacrifice in heat radiation.

The "half accommodated" in this specification is a wide concept including, not only the cases where the package body 18 is accommodated in the opening 12 of the substrate 11 about half but also the cases where arbitrary part, not all, of it is accommodated therein. If only a part of the package body 18 is exposed out of the opening 12, it contributes to a reduction in thickness without a serious decrease in radiation of heat.

Figure 11:
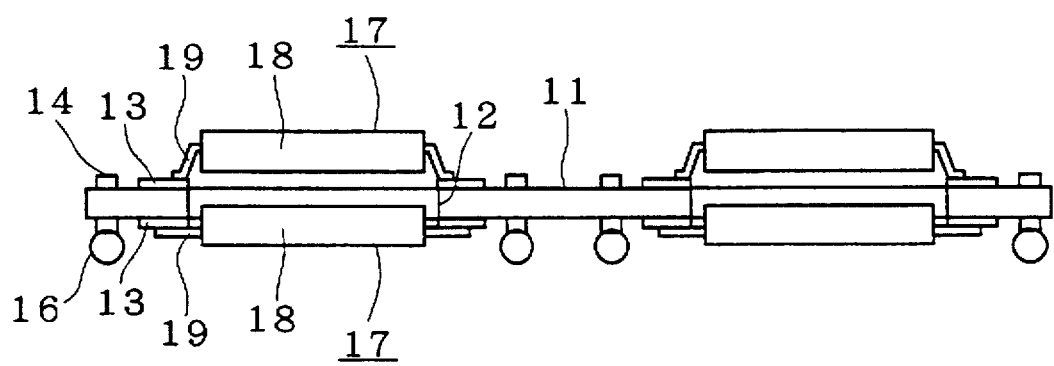
FIG. 11 is a side view illustrating a modification of a semiconductor device according to the present invention.

Furthermore, both of the package bodies 18 on the upper and lower surface sides of the substrate 11 are half accommodated in the opening 12 in the above described preferred embodiments. However, only one of the package bodies IS (the package body 18 on the lower surface side in FIG. 11) may be half accommodated in the opening 12. In such a case, since the thickness of the substrate 11 which permits one of the package bodies 18 to be half accommodated in the opening 12 is sufficient, the substrate 11 may be relatively thin. In general, it is known that a marginal distance between the end of the substrate and a conductive pattern on the substrate is proportional to the thickness of the substrate in terms of reliability during the processing of the outer shape of the substrate. Therefore, in the semiconductor device of FIG. 11, the relatively thin substrate provides for the shorter marginal distance, allowing size reduction of the device.

Moreover, although the embodiments have shown the cases in which the leads 19 protrude from the opposite two sides of the package body 18, the present invention, except for the fifth preferred embodiment, can also be applied similarly to the cases where they protrude from four sides.

While the invention has been described in detail, the foregoing description is in all aspects illustrative and not restrictive. It is understood that numerous other modifications and variations can be devised without departing from the scope of the invention.

I claim:

1. A semiconductor device comprising:

a substrate having an upper surface, a lower surface, and an opening; and first and second integrated circuit packages, each integrated circuit package having a package body facing the opening, and straight leads protruding from said package body and supported on said substrate at a periphery of the opening, said first and second integrated circuit packages being disposed on the upper surface and the lower surface of said substrate, respectively, half of at least one of the package bodies of said first and second integrated circuit packages being disposed within the opening.

2. The semiconductor device according to claim 1, comprising:

external connection terminals disposed on the upper surface and the lower surface of said substrate and electrically connected to said leads on the same surface, corresponding external connection terminals on said upper surface and on said lower surface being electrically connected to each other; and solder bumps on said external connection terminals on one of the upper and lower surfaces of said substrate.

3. The semiconductor device according to claim 2, wherein said external connection terminals are provided in a larger number than said leads so that at least one dummy terminal connected to a lead on one of the upper and lower surfaces is present and is not connected to a lead on the other of the upper and lower surfaces.

4. The semiconductor device according to claim 3, wherein said external connection terminals include a plurality of said dummy terminals aligned in a first linear array and a second linear array of said external connection terminals other than said dummy terminals.

5. The semiconductor device according to claim 4, wherein said linear array of said dummy terminals and said linear array of said external connection terminals other than said dummy terminals are arranged in a staggered configuration.

6. A semiconductor device comprising:

a substrate having an upper surface, a lower surface, and an opening; and first and second integrated circuit packages, each integrated circuit package having a package body facing the opening, and leads protruding from said package body and supported on said substrate at a periphery of the opening, said first and second integrated circuit packages being disposed on the upper surface and the lower surface of said substrate, respectively, half of at least one of the package bodies of the first and second integrated circuit packages being disposed within the opening and wherein the opening does not completely surround said first and second integrated circuit packages.

7. A method of manufacturing a semiconductor device including a substrate having an upper surface, a lower surface, and an opening, first and second integrated circuit packages, each integrated circuit package having a package body half of which is disposed in the opening and leads protruding from said package body and supported on said substrate at a periphery of the opening, external connection terminals disposed on the upper surface and the lower surface of said substrate with corresponding external connection terminals on the lower surface and the upper surface being electrically connected to each other, said external connection terminals being electrically connected to said leads on the same surface, and solder bumps disposed on said external connection terminals on one surface of said substrate, comprising:

stacking a plurality of said semiconductor devices on a first surface of a mother board, wherein a solder paste is supplied to abutments between said solder bumps;

melting said solder bumps to connect said plurality of stacked semiconductor devices to the first surface of said mother board;

turning over said mother board and stacking a plurality of said semiconductor devices on a second surface of said mother board, wherein a solder paste is supplied to abutments between said solder bumps; and melting said solder bumps to connect said plurality of stacked semiconductor devices to the second surface of said mother board.

8. A semiconductor device structure comprising:

a plurality of first semiconductor devices, each first semiconductor device comprising:

a substrate having an upper surface, a lower surface, an opening, and external connection terminals disposed on the upper surface and the lower surface of said substrate, corresponding external connection terminals on the upper surface and the lower surface being electrically connected to each other;

first and second integrated circuit packages, each integrated circuit package having a package body facing the opening, leads protruding from said package body and supported on said substrate at a periphery of the opening, half of the package body of at least one of said first and second integrated circuit packages being disposed in the opening, and said leads being electrically connected to said external connection terminals on the same surface; and solder bumps on said external connection terminals;

wherein said plurality of first semiconductor devices are arranged in a stack, with adjacent first semiconductor devices connected to each other with the solder bumps; and a mother board having a first surface and a second surface, opposite the first surface, said first semiconductor devices being disposed on said first surface of said mother board and electrically connected to the first surface of said mother board by said solder bumps.

9. The semiconductor device of claim 11 comprising:

a plurality of second semiconductor devices, each second semiconductor device comprising:

a substrate having an upper surface, a lower surface, an opening, and external connection terminals disposed on the upper surface and the lower surface of said substrate, corresponding external connection terminals on the upper surface and the lower surface being electrically connected to each other;

first and second integrated circuit packages, each integrated circuit package having a package body facing the opening, leads protruding from said package body and supported on said substrate at a periphery of the opening, half of the package body of at least one of said first and second integrated circuit packages each being disposed in the opening, and said leads being electrically connected to said external connection terminals on the same surface; and solder bumps on said external connection terminals;

wherein said second semiconductor devices are arranged in a stack, with adjacent second semiconductor devices connected to each other with the solder bumps, the stack of second semiconductor devices being disposed on said second surface of said mother board and electrically connected to the second surface of said mother board by said solder bumps.

10. The semiconductor device according to claim 2 wherein said external connection terminals are disposed entirely outside said first and second integrated circuit packages.

* * * * *